US012796394B2

(12) United States Patent
Ogata et al.

(10) Patent No.: US 12,796,394 B2
(45) Date of Patent: Nov. 10, 2026

(54) LAMINATE, METHOD FOR MANUFACTURING LAMINATE, AND METHOD FOR MANUFACTURING SEMICONDUCTOR SUBSTRATE

(71) Applicant: NISSAN CHEMICAL CORPORATION, Tokyo (JP)

(72) Inventors: Hiroto Ogata, Toyama (JP); Tetsuya Shinjo, Toyama (JP); Shunsuke Moriya, Toyama (JP); Takuya Fukuda, Toyama (JP); Takahisa Okuno, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 467 days.

(21) Appl. No.: 18/039,088

(22) PCT Filed: Nov. 26, 2021

(86) PCT No.: PCT/JP2021/043355

§ 371 (c)(1),
(2) Date: May 26, 2023

(87) PCT Pub. No.: WO2022/114112

PCT Pub. Date: Jun. 2, 2022

(65) Prior Publication Data

US 2024/0006221 A1 Jan. 4, 2024

(30) Foreign Application Priority Data

Nov. 30, 2020 (JP) ................................ 2020-198802

(51) Int. Cl.
*H10P 72/70* (2026.01)
*H10P 52/00* (2026.01)

(52) U.S. Cl.
CPC .......... *H10P 72/7402* (2026.01); *H10P 52/00* (2026.01); *H10P 72/7416* (2026.01)

(58) Field of Classification Search
CPC ............... H01L 21/304; H01L 21/6835; H01L 21/30625; C09D 183/04
See application file for complete search history.

(56) References Cited

U.S. PATENT DOCUMENTS 7,541,264 B2 6/2009 Gardner et al.
8,911,583 B2 12/2014 Jakob
(Continued)

FOREIGN PATENT DOCUMENTS

GB 2530388 A 3/2016
JP 5-267303 10/1993
(Continued)

OTHER PUBLICATIONS

WO-2015112330-A1 (Year: 2015).*
(Continued)

*Primary Examiner* — Brian Turner
(74) *Attorney, Agent, or Firm* — Greenblum & Bernstein, P.L.C.

(57) ABSTRACT

There is provided a laminate including: a support substrate; a semiconductor substrate having a bump on a side of the support substrate; an inorganic material layer interposed between the support substrate and the semiconductor substrate and in contact with the semiconductor substrate; and an adhesive layer interposed between the support substrate and the inorganic material layer and in contact with the support substrate and the inorganic material layer, in which the laminate is used for an application in which the support substrate and the semiconductor substrate are separated from each other after processing of the semiconductor substrate in the laminate, and an adhesive force between the inorganic
(Continued)

material layer and the adhesive layer when the support substrate and the semiconductor substrate are separated from each other is smaller than an adhesive force between the inorganic material layer and the semiconductor substrate.

8 Claims, 3 Drawing Sheets

(56) References Cited

U.S. PATENT DOCUMENTS

| | | | | |
|---|---|---|---|---|
| 2010/0248428 | A1* | 9/2010 | Yoshida | H10W 72/019 438/118 |
| 2015/0024574 | A1 | 1/2015 | Kim et al. | |
| 2018/0151268 | A1* | 5/2018 | Matsuura | B32B 17/061 |
| 2018/0151405 | A1* | 5/2018 | Moriyama | C09J 7/245 |
| 2019/0164802 | A1* | 5/2019 | Ogino | C09J 11/06 |
| 2020/0113066 | A1* | 4/2020 | Nakamura | H05K 3/0097 |
| 2021/0249735 | A1* | 8/2021 | Saeki | H01M 50/461 |
| 2022/0002591 | A1 | 1/2022 | Sawada et al. | |
| 2022/0025236 | A1 | 1/2022 | Moriya et al. | |

FOREIGN PATENT DOCUMENTS

| | | | |
|---|---|---|---|
| JP | 2008-532313 | A | 8/2008 |
| JP | 2009-528688 | A | 8/2009 |
| JP | 5335443 | B2 | 11/2013 |
| TW | 201545874 | A | 12/2015 |
| WO | 2020/100965 | A1 | 5/2020 |
| WO | 2020/111069 | A1 | 6/2020 |

OTHER PUBLICATIONS

Extended European Search Report that issued in European Patent Application No. 21898084.5, dated Sep. 24, 2024.

Office Action that issued in Taiwanese Patent Appl. No. 110144273, dated Dec. 20, 2024, along with English translation thereof.

International Search Report and Written Opinion of the International Searching Authority issued in International Pat. Appl. No. PCT/JP2021/043355, dated Jan. 18, 2022, along with an English translation thereof.

Written Opinion that issued on Feb. 13, 2026, in corresponding Singaporean patent application No. 11202303517S.

Office Action that issued on Jul. 18, 2026, in corresponding Chinese patent application No. 202180079636.8.

* cited by examiner

[FIG. 1]
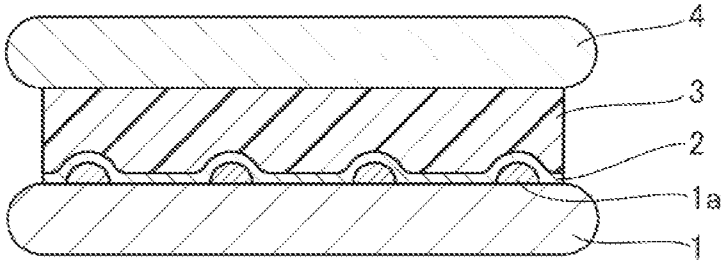
[FIG. 2A]
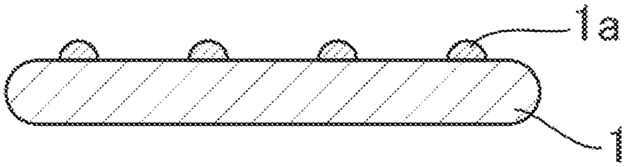
[FIG. 2B]
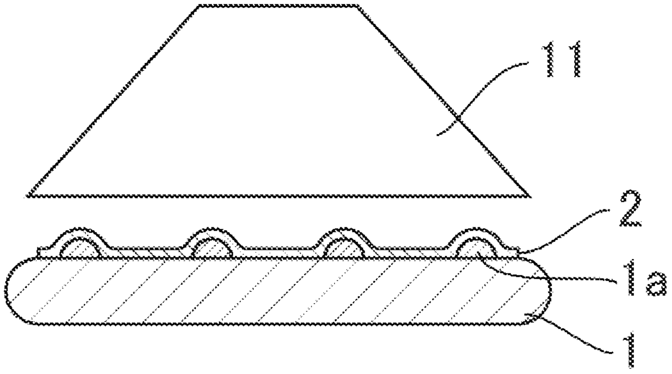
[FIG. 2C]
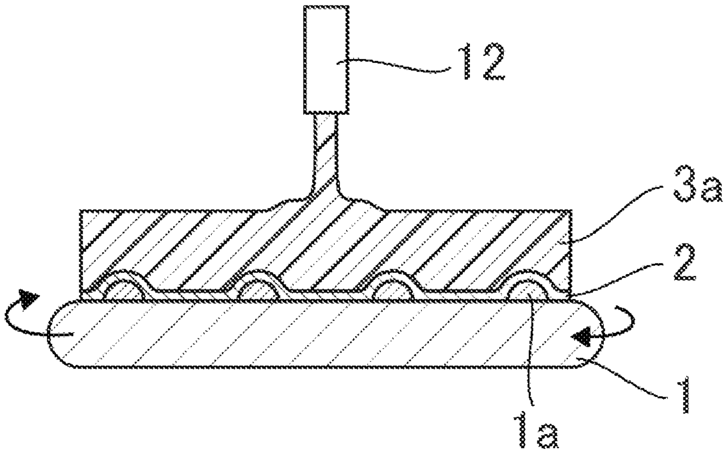

[FIG. 2D]
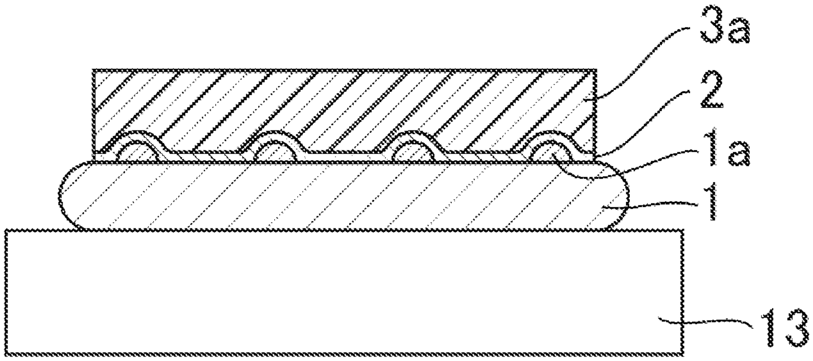
[FIG. 2E]
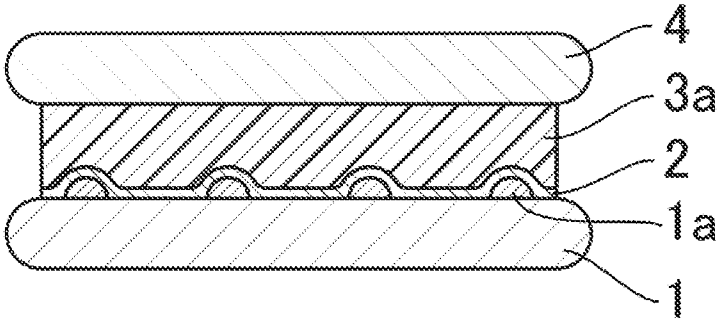
[FIG. 2F]
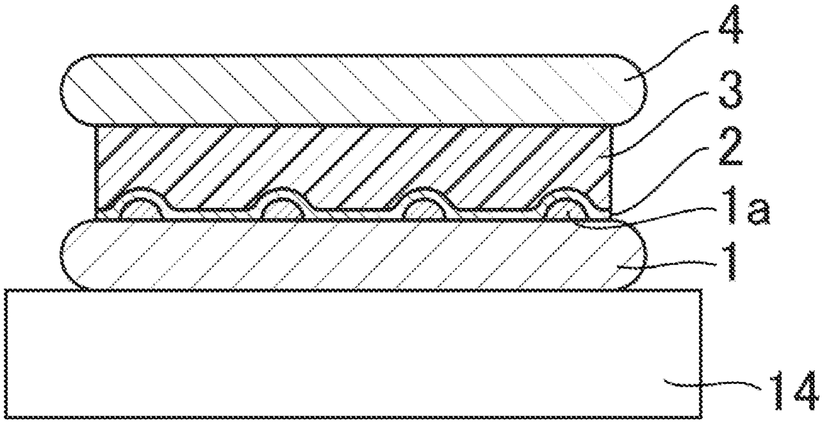

[FIG. 2G]
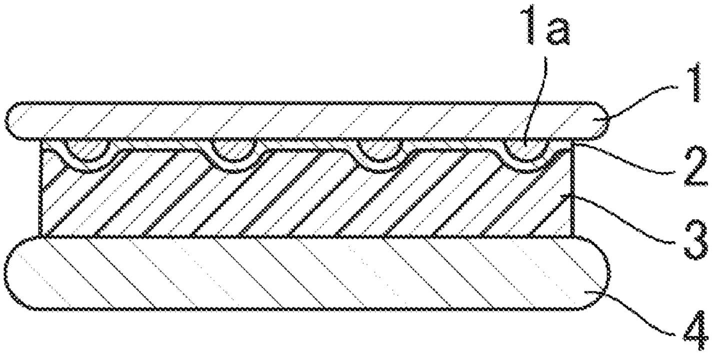
[FIG. 2H]
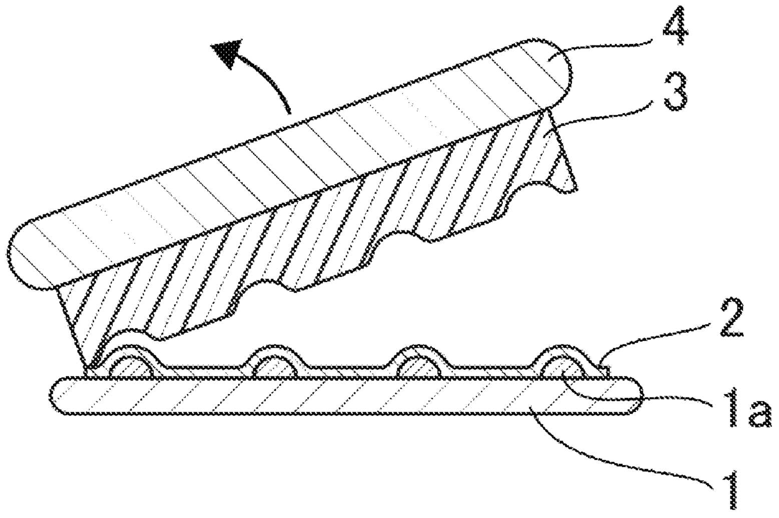
[FIG. 2I]
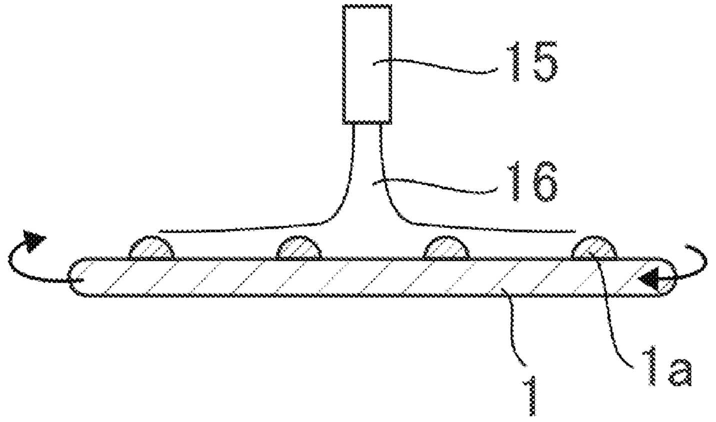

LAMINATE, METHOD FOR MANUFACTURING LAMINATE, AND METHOD FOR MANUFACTURING SEMICONDUCTOR SUBSTRATE

TECHNICAL FIELD

The present invention relates to a laminate, a method for manufacturing a laminate, and a method for manufacturing a semiconductor substrate.

BACKGROUND ART

For a semiconductor wafer that has been integrated in a two-dimensional planar direction in the related art, there is a demand for a semiconductor integration technique that integrates (laminates) planes in a three-dimensional direction for the purpose of further integration. The three-dimensional lamination is a technique of laminating layers into a multi-layer while connecting the layers by a through-silicon via (TSV). At the time of multi-layer lamination, each of wafers to be integrated is thinned by polishing on a side opposite to the formed circuit surface (that is, a rear surface), and the thinned semiconductor wafers are laminated.

In order to polish a semiconductor wafer before thinning (also simply referred to herein as a "wafer") with a polishing device, the semiconductor wafer before thinning adheres to a support.

The adhesion at that time is referred to as temporary adhesion because it should be easily peeled off after polishing. This temporary adhesion should be easily removed from the support, and the thinned semiconductor wafer may be cut or deformed when a large force is applied for removal. Therefore, the semiconductor wafer is easily removed so that such a situation does not occur. However, at the time of polishing the rear surface of the semiconductor wafer, it is not preferable that the semiconductor wafer is detached or displaced due to a polishing stress. Therefore, the performance required for the temporary adhesion is to withstand the stress during polishing and to be easily removed after polishing.

For example, there is a demand for performance having a high stress (strong adhesive force) in a planar direction at the time of polishing and a low stress (weak adhesive force) in a longitudinal direction at the time of removal.

As such an adhesion process, there has been proposed a wafer support structure including, between a wafer (1) that is a semiconductor wafer and a support layer (6) that is a support, a silicone oil layer, a separation layer (4) that is a plasma polymer layer, and a layer (5) of a partially cured or curable elastomer material from the wafer (1) side, in which an adhesive bond between a support layer system and the separation layer (4) after the elastomer material is completely cured is larger than an adhesive bond between the wafer (1) and the separation layer (4) (for example, see Examples of Patent Literature 1).

In recent years, as a technique for reducing the number of layers interposed between a semiconductor wafer and a support, a method including:

(1) a step of forming a film by applying an addition reaction curable adhesive composition to a first substrate;

and optionally, (2) a step of heating a product of the step (1);

(3) a step of attaching a second substrate to the film, in which at least one of the first substrate and the second substrate is a semiconductor wafer;

(4) a step of forming a cured film by curing the film;

(5) a step of processing the semiconductor wafer; and (6) a step of removing the cured film with an etchant, is proposed (see Patent Literature 2).

CITATION LIST

Patent Literature

Patent Literature 1: JP 5335443 B2
Patent Literature 2: JP 2008-532313 A

SUMMARY OF INVENTION

Technical Problem

In the technique described in Examples of Patent Literature 1, three layers are interposed between the semiconductor substrate and the support substrate. On the other hand, in the technique described in Patent Literature 2, one layer is interposed between the semiconductor substrate and the support substrate, and in the technique described in Patent Literature 2, the system is simplified.

However, as in the technique described in Patent Literature 2, in a case where the layer interposed between the semiconductor substrate and the support substrate is one adhesive layer, a bump of the semiconductor substrate may be deformed during processing of the semiconductor substrate.

Therefore, an object of the present invention is to provide a laminate capable of suppressing deformation of a bump while suppressing the number of layers interposed between a semiconductor substrate and a support substrate when manufacturing a processed semiconductor substrate, a method for manufacturing a semiconductor substrate using the laminate, and a method for manufacturing the laminate.

Solution to Problem

As a result of intensive studies to solve the above problems, the present inventors have found that the above problems can be solved, thereby completing the present invention having the following gist.

That is, the present invention encompasses the following.

[1] A laminate including:

a support substrate;

a semiconductor substrate having a bump on a side of the support substrate;

an inorganic material layer interposed between the support substrate and the semiconductor substrate and in contact with the semiconductor substrate; and an adhesive layer interposed between the support substrate and the inorganic material layer and in contact with the support substrate and the inorganic material layer, in which the laminate is used for an application in which the support substrate and the semiconductor substrate are separated from each other after processing of the semiconductor substrate in the laminate, and an adhesive force between the inorganic material layer and the adhesive layer when the support substrate and the semiconductor substrate are separated from each other is smaller than an adhesive force between the inorganic material layer and the semiconductor substrate.

[2] The laminate according to [1], in which the adhesive layer is a layer formed of an adhesive composition.

[3] The laminate according to [2], in which the adhesive composition contains a polyorganosiloxane.

[4] The laminate according to [3], in which the adhesive composition contains a component (A) which is cured and the polyorganosiloxane as a component (B) which does not cause a curing reaction.

[5] The laminate according to [4], in which the component (A) is a component which is cured by a hydrosilylation reaction.

[6] The laminate according to [4] or [5], in which the component (A) contains:

a polyorganosiloxane (a1) having an alkenyl group having 2 to 40 carbon atoms bonded to a silicon atom;

a polyorganosiloxane (a2) having a Si—H group; and a platinum group metal-based catalyst (A2).

[7] The laminate according to any one of [4] to [6], in which the component (B) is a polydimethylsiloxane which may be modified.

[8] The laminate according to any one of [1] to [7], in which the inorganic material layer is a layer obtained by plasma-polymerizing an organosilicon compound on the semiconductor substrate.

[9] A method for manufacturing a semiconductor substrate, the method including:

processing the semiconductor substrate in the laminate according to any one of [1] to [8];

separating the support substrate and the processed semiconductor substrate from each other by separating the inorganic material layer and the adhesive layer from each other; and removing the inorganic material layer.

[10] The method for manufacturing a semiconductor substrate according to [9], in which the processing includes polishing a surface of the semiconductor substrate opposite to a surface on which the bump exists to thin the semiconductor substrate.

[11] A method for manufacturing the laminate according to any one of [1] to [8], the method including:

forming the inorganic material layer on a surface of the semiconductor substrate on which the bump exists;

forming an adhesive coating layer which provides the adhesive layer on the inorganic material layer;

forming the adhesive layer by heating the adhesive coating layer in a state where the support substrate and the adhesive coating layer are in contact with each other and the adhesive coating layer and the inorganic material layer are in contact with each other.

Advantageous Effects of Invention

According to the present invention, it is possible to provide a laminate capable of suppressing deformation of a bump while suppressing the number of layers interposed between a semiconductor substrate and a support substrate when manufacturing a processed semiconductor substrate, a method for manufacturing a semiconductor substrate using the laminate, and a method for manufacturing the laminate.

BRIEF DESCRIPTION OF DRAWINGS

FIG. 1 is a schematic cross-sectional view of an example of a laminate.

FIG. 2A is a view (part 1) for explaining an aspect in which a laminate is manufactured and a thinned wafer is manufactured.

FIG. 2B is a view (part 2) for explaining an aspect in which a laminate is manufactured and a thinned wafer is manufactured.

FIG. 2C is a view (part 3) for explaining an aspect in which a laminate is manufactured and a thinned wafer is manufactured.

FIG. 2D is a view (part 4) for explaining an aspect in which a laminate is manufactured and a thinned wafer is manufactured.

FIG. 2E is a view (part 5) for explaining an aspect in which a laminate is manufactured and a thinned wafer is manufactured.

FIG. 2F is a view (part 6) for explaining an aspect in which a laminate is manufactured and a thinned wafer is manufactured.

FIG. 2G is a view (part 7) for explaining an aspect in which a laminate is manufactured and a thinned wafer is manufactured.

FIG. 2H is a view (part 8) for explaining an aspect in which a laminate is manufactured and a thinned wafer is manufactured.

FIG. 2I is a view (part 9) for explaining an aspect in which a laminate is manufactured and a thinned wafer is manufactured.

DESCRIPTION OF EMBODIMENTS (Laminate)

A laminate of the present invention includes a support substrate, a semiconductor substrate, an inorganic material layer, and an adhesive layer.

The semiconductor substrate has bumps on a side of the support substrate.

The inorganic material layer is interposed between the support substrate and the semiconductor substrate.

The inorganic material layer is in contact with the semiconductor substrate.

The adhesive layer is interposed between the support substrate and the inorganic material layer.

The adhesive layer is in contact with the support substrate and the inorganic material layer.

The laminate is used for an application in which the support substrate and the semiconductor substrate are separated from each other after processing of the semiconductor substrate in the laminate.

An adhesive force between the inorganic material layer and the adhesive layer when the support substrate and the semiconductor substrate are separated from each other is smaller than an adhesive force between the inorganic material layer and the semiconductor substrate. Here, when the support substrate and the semiconductor substrate are separated from each other, the adhesive force between the inorganic material layer and the adhesive layer being smaller than the adhesive force between the inorganic material layer and the semiconductor substrate means that, when the support substrate and the semiconductor substrate are separated from each other by mechanical peeling, for example, when the support substrate and the semiconductor substrate are mechanically peeled off with equipment having a sharp portion, the inorganic material layer and the semiconductor substrate are not separated from each other, and the inorganic material layer and the adhesive layer are separated from each other.

In the laminate, the inorganic material layer is formed in contact with the semiconductor substrate, such that it is possible to suppress deformation of the bump when manufacturing a processed semiconductor substrate. This is considered to be because the bump that is likely to be melted or deformed by heat and pressure during processing of the semiconductor substrate is protected by the inorganic material layer that is less likely to be melted and deformed, and as a result, the shape of the bump is maintained.

In addition, when the support substrate and the semiconductor substrate are separated from each other, the inorganic material layer and the adhesive layer can be separated from each other, and thus it is not necessary to provide a peeling layer between the semiconductor substrate and the inorganic material layer. Therefore, the number of layers interposed between the semiconductor substrate and the support substrate can be suppressed, and as a result, improvement in product efficiency can be expected.

<Support Substrate>

The support substrate is not particularly limited as long as it is a member capable of supporting the semiconductor substrate when the semiconductor substrate is processed, and examples thereof include a glass support substrate and a silicon support substrate.

A shape of the support substrate is not particularly limited, and examples thereof include a disk shape. Note that the disk-shaped support substrate does not need to have a completely circular surface shape, and for example, an outer periphery of the support substrate may have a straight portion called an orientation flat or may have a cut called a notch.

A thickness of the disk-shaped support substrate may be appropriately determined according to a size of the semiconductor substrate and the like, and is not particularly limited, but is, for example, 500 to 1,000 μm.

A diameter of the disk-shaped support substrate may be appropriately determined according to the size of the semiconductor substrate and the like, and is not particularly limited, but is, for example, 100 to 1,000 mm.

An example of the support substrate is a glass wafer or a silicon wafer having a diameter of 300 mm and a thickness of about 700 μmm.

<Semiconductor Substrate>

The semiconductor substrate has bumps. The bump is a protruding terminal.

In the laminate, the semiconductor substrate has bumps on a side of the support substrate.

In the semiconductor substrate, the bump is usually formed on a surface on which a circuit is formed. The circuit may be a single layer or may be a multi-layer. A shape of the circuit is not particularly limited.

In the semiconductor substrate, a surface opposite to a surface having the bump (rear surface) is a surface to be processed.

A main material constituting the entire semiconductor substrate is not particularly limited as long as it is used for this type of application, and examples thereof include silicon, silicon carbide, and a compound semiconductor.

A shape of the semiconductor substrate is not particularly limited, and examples thereof include a disk shape. Note that the disk-shaped semiconductor substrate does not need to have a completely circular surface shape, and for example, an outer periphery of the semiconductor substrate may have a straight portion called an orientation flat or may have a cut called a notch.

A thickness of the disk-shaped semiconductor substrate may be appropriately determined according to a purpose of use of the semiconductor substrate and the like, and is not particularly limited, but is, for example, 500 to 1,000 μm.

A diameter of the disk-shaped semiconductor substrate may be appropriately determined according to a purpose of use of the semiconductor substrate and the like, and is not particularly limited, but is, for example, 100 to 1,000 mm.

An example of the semiconductor substrate is a silicon wafer having a diameter of 300 mm and a thickness of about 770 μm.

The material, size, shape, structure, and density of the bumps of the semiconductor substrate are not particularly limited.

Examples of the bump include a ball bump, a print bump, a stud bump, and a plating bump.

Usually, a height, diameter, and pitch of the bump are appropriately determined from conditions of a bump height of about 1 to 200 μm, a bump diameter of 1 to 200 μm, and a bump pitch of 1 to 500 μm.

Examples of the material of the bump include a solder having a low melting point, a solder having a high melting point, tin, indium, gold, silver, and copper. The bump may be formed of only a single component or may be formed of a plurality of components. More specific examples thereof include alloy plating mainly containing Sn, such as SnAg bumps, SnBi bumps, Sn bumps, or AuSn bumps.

In addition, the bump may have a laminated structure including a metal layer containing at least one of these components.

<Inorganic Material Layer>

The inorganic material layer is not particularly limited as long as it is a layer formed of an inorganic material, and examples thereof include a layer formed of a compound such as an oxide, a nitride, or a carbide of at least one element selected from the group consisting of silicon, boron, titanium, zirconium, and aluminum, and a mixture thereof.

Preferably, the inorganic material layer is a layer obtained by plasma-polymerizing an organosilicon compound.

The inorganic material layer is formed by, for example, a chemical vapor deposition (CVD) method. For example, plasma polymerization coating is performed by a chemical vapor deposition method.

Examples of the material used for the plasma polymerization coating include an organosilicon compound. For example, plasma polymerization coating of an organosilicon compound is performed on the semiconductor substrate, such that a raw material gas containing the organosilicon compound can be decomposed to form an inorganic material layer which is a thin film containing a Si—O bond on a surface of the semiconductor substrate.

It is preferable that a gas containing oxygen such as $O_2$ or $N_2O$ is blended in the raw material gas containing the organosilicon compound. In addition, a rare gas such as argon or helium may be blended in the raw material gas as a carrier gas. In a preferred example of the method for decomposing the raw material gas, the raw material gas is decomposed by the generated plasma under an appropriate pressure condition using a plasma generator. Note that a technique of decomposing a raw material gas using plasma to form a film (layer) may be generally referred to as a plasma polymerization method.

Examples of the organosilicon compound include a siloxane compound, a disilazane compound, and a silane compound.

Examples of the siloxane compound include chain siloxanes such as 1,1,3,3-tetramethyldisiloxane, pentamethyldisiloxane, hexamethyldisiloxane, 1,1,3,3-tetraphenyl-1,3-dimethyldisiloxane, 1,3-divinyltetramethyldisiloxane, 1,1, 3,3,5,5-hexamethyltrisiloxane, 1,1,1,3,5,5,5-heptamethyltrisiloxane, octamethyltrisiloxane, 1,1,1,3,5,7,7,7-octamethyltetrasiloxane, decamethyltetrasiloxane, and 1,1,5,5-tetraphenyl-1,3,3,5-tetramethyltrisiloxane; and cyclic siloxanes such as hexamethylcyclotrisiloxane, 1,3,5,7-tetramethylcyclotetrasiloxane, octamethylcyclotetrasiloxane, decamethylcyclopentasiloxane, and 1,3,5,7-tetravinyl-1,3,5,7-tetramethylcyclotetrasiloxane.

Examples of the disilazane compound include 1,1,3,3-tetramethyldisilazane, hexamethyldisilazane, heptamethyldisilazane, hexamethylcyclotrisilazane, and 1,1,3,3,5,5,7,7-octamethylcyclotetrasilazane.

Examples of the silane compound include methylsilane, dimethylsilane, trimethylsilane, tetramethylsilane, trimethoxysilane, triethylsilane, trichloromethylsilane, dichlorodimethylsilane, chlorotrimethylsilane, tetramethoxysilane, trimethoxymethylsilane, ethyltrimethoxysilane, dimethoxydimethylsilane, methoxytrimethylsilane, tetraethoxysilane, triethoxymethylsilane, triethoxyethylsilane, diethoxydimethylsilane, ethoxytrimethylsilane, diethoxymethylsilane, ethoxydimethylsilane, acetoxytrimethylsilane, allyloxytrimethylsilane, allyl trimethylsilane, butoxytrimethylsilane, butyltrimethoxysilane, diacetoxydimethylsilane, dimethoxydiphenylsilane, diethoxydiphenylsilane, dimethoxymethylphenylsilane, ethoxydimethylvinylsilane, diphenylsilanediol, triacetoxymethylsilane, triacetoxyethylsilane, 3-glycidyloxypropyltrimethoxysilane, hexyltrimethoxysilane, 3-mercaptopropyltrimethoxysilane, octadecyltriethoxysilane, triethoxyoctylsilane, triethoxyphenylsilane, trimethylphenylsilane, propoxytrimethylsilane, triethoxypropylsilane, tetraacetoxysilane, tetrabutoxysilane, tetrapropoxysilane, triacetoxyvinylsilane, triethoxyvinylsilane, trimethoxyvinylsilane, triphenylsilanol, trimethylvinylsilane, and tris(2-methoxyethoxy)vinylsilane.

The inorganic material layer is formed on the semiconductor substrate. By doing so, a layer following the shape of the bump of the semiconductor substrate can be formed, and the effect of suppressing deformation of the bump is more excellent.

A thickness of the inorganic material layer is not particularly limited, but is usually 1 to 1,000 nm, and is preferably 100 to 500 nm from the viewpoint of realizing suppression of the deformation of the bump with excellent reproducibility.

<Adhesive Layer>

The adhesive layer is interposed between the support substrate and the inorganic material layer.

The adhesive layer is a layer in contact with the support substrate and the inorganic material layer.

The adhesive layer is not particularly limited, and is preferably a layer formed of an adhesive composition.

<<Adhesive Composition>>

Examples of the adhesive composition include, but are not limited to, a polysiloxane-based adhesive, an acrylic resin-based adhesive, an epoxy resin-based adhesive, a polyamide-based adhesive, a polystyrene-based adhesive, a polyimide adhesive, and a phenol resin-based adhesive.

Among them, a polysiloxane-based adhesive is preferable as the adhesive composition because it exhibits preferred adhesive ability during processing of the semiconductor substrate or the like, can be preferably peeled off after processing, and further has excellent heat resistance.

In a preferred aspect, the adhesive composition used in the present invention contains a polyorganosiloxane.

In another preferred aspect, the adhesive composition used in the present invention contains a component (A) which is cured to be an adhesive component and a component (B) which does not cause a curing reaction. Examples of the component (B) which does not cause a curing reaction include a polyorganosiloxane. Note that, in the present invention, "which does not cause a curing reaction" does not mean that all curing reactions are not caused, but means that a curing reaction occurring in the component (A) which is cured is not caused.

In still another preferred aspect, the component (A) may be a component which is cured by a hydrosilylation reaction or a polyorganosiloxane component (A') which is cured by a hydrosilylation reaction.

In still another preferred aspect, as an example of the component (A'), the component (A) contains, for example, a polyorganosiloxane (a1) having an alkenyl group having 2 to 40 carbon atoms bonded to a silicon atom, a polyorganosiloxane (a2) having a Si—H group, and a platinum group metal-based catalyst (A2). Here, the alkenyl group having 2 to 40 carbon atoms may be substituted. Examples of a substituent include a halogen atom, a nitro group, a cyano group, an amino group, a hydroxy group, a carboxyl group, an aryl group, and a heteroaryl group.

In still another preferred aspect, the polyorganosiloxane component (A') which is cured by a hydrosilylation reaction contains a polysiloxane (A1) containing one or two or more units selected from the group consisting of a siloxane unit (Q unit) represented by $SiO_2$, a siloxane unit (M unit) represented by $R^1R^2R^3SiO_{1/2}$, a siloxane unit (D unit) represented by $R^4R^5SiO_{2/2}$, and a siloxane unit (T unit) represented by $R^6SiO_{3/2}$, and a platinum group metal-based catalyst (A2), and the polysiloxane (A1) contains one or two or more units selected from the group consisting of a siloxane unit (Q' unit) represented by $SiO_2$, a siloxane unit (M' unit) represented by $R^{1'}R^{2'}R^{3'}SiO_{1/2}$, a siloxane unit (D' unit) represented by $R^{4'}R^{5'}SiO_{2/2}$, and a siloxane unit (T' unit) represented by $R^{6'}SiO_{3/2}$, contains a polyorganosiloxane (a1') containing at least one selected from the group consisting of an M' unit, a D' unit, and a T' unit, and one or two or more units selected from the group consisting of one or two or more units selected from the group consisting of a siloxane unit (Q" unit) represented by $SiO_2$, a siloxane unit (M" unit) represented by $R^{1''}R^{2''}R^{3''}SiO_{1/2}$, a siloxane unit (D" unit) represented by $R^{4''}R^{5''}SiO_{2/2}$, and a siloxane unit (T" unit) represented by $R^{6''}SiO_{3/2}$, and contains a polyorganosiloxane (a2') containing at least one selected from the group consisting of an M" unit, a D" unit, and a T" unit.

Note that (a1') is an example of (a1) and (a2') is an example of (a2).

$R^1$ to $R^6$ are groups or atoms bonded to silicon atoms, and each independently represent an alkyl group which may be substituted, an alkenyl group which may be substituted, or a hydrogen atom. Examples of a substituent include a halogen atom, a nitro group, a cyano group, an amino group, a hydroxy group, a carboxyl group, an aryl group, and a heteroaryl group.

$R^{1'}$ to $R^{6'}$ are groups bonded to silicon atoms, and each independently represent an alkyl group which may be substituted or an alkenyl group which may be substituted, but at least one of $R^{1'}$ to $R^{6'}$ is an alkenyl group which may be substituted. Examples of a substituent include a halogen atom, a nitro group, a cyano group, an amino group, a hydroxy group, a carboxyl group, an aryl group, and a heteroaryl group.

$R^{1''}$ to $R^{6''}$ are groups or atoms bonded to silicon atoms, and each independently represent an alkyl group which may be substituted or a hydrogen atom, but at least one of $R^{1''}$ to $R^{6''}$ is a hydrogen atom. Examples of a substituent include a halogen atom, a nitro group, a cyano group, an amino group, a hydroxy group, a carboxyl group, an aryl group, and a heteroaryl group.

The alkyl group may be a linear, branched, or cyclic alkyl group, but is preferably a linear or branched alkyl group, and the number of carbon atoms thereof is not particularly limited, but is usually 1 to 40, preferably 30 or less, more preferably 20 or less, and still more preferably 10 or less.

Specific examples of the linear or branched alkyl group which may be substituted include, but are not limited to, a methyl group, an ethyl group, an n-propyl group, an i-propyl group, an n-butyl group, an i-butyl group, a s-butyl group, a tert-butyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, and a 1-ethyl-2-methyl-n-propyl group, and the number of carbon atoms thereof is usually 1 to 14, preferably 1 to 10, and more preferably 1 to 6. Among them, a methyl group is particularly preferable.

Specific examples of the cyclic alkyl group which may be substituted include, but are not limited to, cycloalkyl groups such as a cyclopropyl group, a cyclobutyl group, a 1-methyl-cyclopropyl group, a 2-methyl-cyclopropyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group, and bicycloalkyl groups such as a bicyclobutyl group, a bicyclopentyl group, a bicyclohexyl group, a bicycloheptyl group, a bicyclooctyl group, a bicyclononyl group, and a bicyclodecyl group, and the number of carbon atoms thereof is usually 3 to 14, preferably 4 to 10, and more preferably or 6.

The alkenyl group may be a linear, branched, or cyclic alkenyl group, and the number of carbon atoms thereof is not particularly limited, but is usually 2 to 40, preferably 30 or less, more preferably 20 or less, and still more preferably 10 or less.

Specific examples of the linear or branched alkenyl group which may be substituted include, but are not limited to, a vinyl group, an allyl group, a butenyl group, and a pentenyl group, and the number of carbon atoms thereof is usually 2 to 14, preferably 2 to 10, and more preferably 1 to 6. Among them, an ethenyl group and a 2-propenyl group are particularly preferable.

Specific examples of the cyclic alkenyl group which may be substituted include, but are not limited to, cyclopentenyl and cyclohexenyl, and the number of carbon atoms thereof is usually 4 to 14, preferably 5 to 10, and more preferably 5 or 6.

As described above, the polysiloxane (A1) contains a polyorganosiloxane (a1') and a polyorganosiloxane (a2'), and an alkenyl group contained in the polyorganosiloxane (a1') and a hydrogen atom (Si—H group) contained in the polyorganosiloxane (a2') form a crosslinked structure by a hydrosilylation reaction by the platinum group metal-based catalyst (A2) and are cured. As a result, a cured film is formed.

The polyorganosiloxane (a1') contains one or two or more units selected from the group consisting of a Q' unit, an M' unit, a D' unit, and a T' unit, and contains at least one selected from the group consisting of an M' unit, a D' unit, and a T' unit. As the polyorganosiloxane (a1'), two or more kinds of polyorganosiloxanes satisfying such conditions may be used in combination.

Examples of preferred combinations of two or more selected from the group consisting of a Q' unit, an M' unit, a D' unit, and a T' unit include, but are not limited to, (Q' unit and M' unit), (D' unit and M' unit), (T' unit and M' unit), and (Q' unit, T' unit, and M' unit).

In addition, in a case where two or more kinds of polyorganosiloxanes contained in the polyorganosiloxane (a1') are contained, a combination of (Q' unit and M' unit) and (D' unit and M' unit), a combination of (T' unit and M' unit) and (D' unit and M' unit), and a combination of (Q' unit, T' unit, and M' unit) and (T' unit and M' unit) are preferable, but are not limited thereto.

The polyorganosiloxane (a2') contains one or two or more units selected from the group consisting of a Q" unit, an M" unit, a D" unit, and a T" unit, and contains at least one selected from the group consisting of an M" unit, a D" unit, and a T" unit. As the polyorganosiloxane (a2'), two or more kinds of polyorganosiloxanes satisfying such conditions may be used in combination.

Examples of preferred combinations of two or more selected from the group consisting of a Q" unit, an M" unit, a D" unit, and a T" unit include, but are not limited to, (M" unit and D" unit), (Q" unit and M" unit), and (Q" unit, T" unit, and M" unit).

The polyorganosiloxane (a1') is composed of siloxane units in which alkyl groups and/or alkenyl groups are bonded to silicon atoms thereof, and a ratio of alkenyl groups in all substituents represented by $R^{1'}$ to $R^{6'}$ is preferably 0.1 to 50.0 mol %, and more preferably 0.5 to 30.0 mol %, and the remaining $R^{1'}$ to $R^{6'}$ can be alkyl groups.

The polyorganosiloxane (a2') is composed of siloxane units in which alkyl groups and/or hydrogen atoms are bonded to silicon atoms thereof, and a ratio of hydrogen atoms in all substituents and substituent atoms represented by $R^{1''}$ to $R^{6''}$ is preferably 0.1 to 50.0 mol %, and more preferably 10.0 to 40.0 mol %, and the remaining $R^{1''}$ to $R^{6''}$ can be alkyl groups.

In a case where the component (A) contains (a1) and (a2), in a preferred aspect of the present invention, a molar ratio of the alkenyl group contained in the polyorganosiloxane (a1) and the hydrogen atom constituting the Si—H bond contained in the polyorganosiloxane (a2) is in a range of 1.0:0.5 to 1.0:0.66.

A weight average molecular weight of the polysiloxane such as the polyorganosiloxane (a1) or the polyorganosiloxane (a2) is not particularly limited, but is usually 500 to 1,000,000, and is preferably 5,000 to 50,000 from the viewpoint of realizing the effects of the present invention with excellent reproducibility.

Note that, in the present invention, a weight average molecular weight, a number average molecular weight, and a dispersion degree of the polyorganosiloxane can be measured, for example, using a GPC apparatus (manufactured by Tosoh Corporation, EcoSEC, HLC-8320GPC) and a GPC column (manufactured by Tosoh Corporation, TSKgel SuperMultiporeHZ-N, TSKgel SuperMultiporeHZ-H) at a column temperature of 40° C., using tetrahydrofuran as an eluent (elution solvent), and using polystyrene (manufactured by Sigma-Aldrich) as a standard sample at a flow rate of 0.35 mL/min.

A viscosity of each of the polyorganosiloxane (a1) and the polyorganosiloxane (a2) is not particularly limited, but is usually 10 to 1,000,000 (mPa.$), and is preferably 50 to 10,000 (mPa·s) from the viewpoint of realizing the effects of the present invention with excellent reproducibility. Note that the viscosity of each of the polyorganosiloxane (a1) and the polyorganosiloxane (a2) is a value measured at 25° C. with an E-type rotational viscometer.

The polyorganosiloxane (a1) and the polyorganosiloxane (a2) react with each other by a hydrosilylation reaction to form a film. Accordingly, a curing mechanism is different from that via, for example, a silanol group, and therefore, any siloxane does not need to have a silanol group or a functional group that forms a silanol group by hydrolysis, such as an alkyloxy group.

In a preferred aspect of the present invention, the adhesive composition contains a platinum group metal-based catalyst (A2) together with the polyorganosiloxane component (A').

Such a platinum-based metal catalyst is a catalyst for promoting the hydrosilylation reaction between the alkenyl group of the polyorganosiloxane (a1) and the Si—H group of the polyorganosiloxane (a2).

Specific examples of the platinum-based metal catalyst include, but are not limited to, platinum-based catalysts such as platinum black, platinum(II) chloride, chloroplatinic acid, a reaction product of chloroplatinic acid and monohydric alcohol, a complex of chloroplatinic acid and olefins, and platinum bisacetoacetate.

Examples of a complex of platinum and olefins include, but are not limited to, a complex of divinyltetramethyldisiloxane and platinum.

The amount of the platinum group metal-based catalyst (A2) is not particularly limited, but is usually in a range of 1.0 to 50.0 ppm with respect to the total amount of the polyorganosiloxane (a1) and the polyorganosiloxane (a2).

The polyorganosiloxane component (A') may contain a polymerization inhibitor (A3) for the purpose of suppressing the progress of the hydrosilylation reaction.

The polymerization inhibitor is not particularly limited as long as it can suppress the progress of the hydrosilylation reaction, and specific examples thereof include alkynyl alcohols such as 1-ethynyl-1-cyclohexanol and 1,1-diphenyl-2-propion-1-ol.

The amount of the polymerization inhibitor is not particularly limited, but is usually 1000.0 ppm or more with respect to the total amount of the polyorganosiloxane (a1) and the polyorganosiloxane (a2) from the viewpoint of obtaining the effect, and is 10,000.0 ppm or less from the viewpoint of preventing excessive suppression of the hydrosilylation reaction.

As an example, the adhesive composition used in the present invention may contain a component (B) which does not cause a curing reaction and serves as a release agent component together with the component (A) which is cured. Such a component (B) is contained in the adhesive composition, the adhesive force between the inorganic material layer and the adhesive layer can be easily smaller than the adhesive force between the inorganic material layer and the semiconductor substrate, and the obtained adhesive layer can be preferably peeled off with excellent reproducibility.

Typical examples of such a component (B) include a polyorganosiloxane, and specific examples thereof include, but are not limited to, an epoxy group-containing polyorganosiloxane, a methyl group-containing polyorganosiloxane, and a phenyl group-containing polyorganosiloxane.

In addition, examples of the component (B) include a polydimethylsiloxane. The polydimethylsiloxane may be modified. Examples of the polydimethylsiloxane which may be modified include, but are not limited to, an epoxy group-containing polydimethylsiloxane, an unmodified polydimethylsiloxane, and a phenyl group-containing polydimethylsiloxane.

Preferred examples of the polyorganosiloxane as the component (B) include, but are not limited to, an epoxy group-containing polyorganosiloxane, a methyl group-containing polyorganosiloxane, and a phenyl group-containing polyorganosiloxane.

A weight average molecular weight of the polyorganosiloxane as the component (B) is not particularly limited, but is usually 100,000 to 2,000,000, and is preferably 200,000 to 1,200,000 and more preferably 300,000 to 900,000 from the viewpoint of realizing the effect of the present invention with excellent reproducibility. In addition, a dispersion degree thereof is not particularly limited, but is usually 1.0 to 10.0, and is preferably 1.5 to 5.0 and more preferably 2.0 to 3.0 from the viewpoint of realizing preferred peeling with excellent reproducibility. Note that the weight average molecular weight and the dispersion degree can be measured by the above methods related to the polysiloxane.

A viscosity of the polyorganosiloxane as the component (B) is not particularly limited, but is usually 1,000 to 2,000,000 $mm^2/s$. Note that a value of the viscosity of the polyorganosiloxane as the component (B) is expressed by a kinematic viscosity, and is a centistoke (cSt)=$mm^2/s$. The value can also be determined by dividing the viscosity (mPa·s) by the density ($g/cm^3$). That is, the value can be determined from the viscosity and the density measured with an E-type rotational viscometer measured at 25° C., and can be calculated from the equation of kinematic viscosity ($mm^2/s$)=viscosity (mPa.$)/density ($g/cm^3$).

Examples of the epoxy group-containing polyorganosiloxane include an epoxy group-containing polyorganosiloxane containing a siloxane unit ($D^{10}$ unit) represented by $R^{11}R^{12}Sio_{2/2}$.

$R^{11}$ is a group bonded to a silicon atom and represents an alkyl group, $R^{12}$ is a group bonded to a silicon atom and represents an epoxy group or an organic group containing an epoxy group, and specific examples of the alkyl group include the examples described above.

The epoxy group in the organic group containing an epoxy group may be an independent epoxy group without being fused with other rings, or may be an epoxy group forming a fused ring with other rings, such as a 1,2-epoxycyclohexyl group.

Specific examples of the organic group containing an epoxy group include, but are not limited to, 3-glycidoxypropyl and 2-(3,4-epoxycyclohexyl)ethyl.

In the present invention, preferred examples of the epoxy group-containing polyorganosiloxane include, but are not limited to, an epoxy group-containing polydimethylsiloxane.

The epoxy group-containing polyorganosiloxane contains the siloxane unit ($D^{10}$ unit) described above, but may contain a Q unit, an M unit, and/or a T unit in addition to the $D^{10}$ unit.

In a preferred aspect of the present invention, specific examples of the epoxy group-containing polyorganosiloxane include a polyorganosiloxane containing only a $D^{10}$ unit, a polyorganosiloxane containing a $D^{10}$ unit and a Q unit, a polyorganosiloxane containing a $D^{10}$ unit and an M unit, a polyorganosiloxane containing a $D^{10}$ unit and a T unit, a polyorganosiloxane containing a $D^{10}$ unit, a Q unit, and an M unit, a polyorganosiloxane containing a $D^{10}$ unit, an M unit, and a T unit, and a polyorganosiloxane containing a $D^{10}$ unit, a Q unit, an M unit, and a T unit.

The epoxy group-containing polyorganosiloxane is preferably an epoxy group-containing polydimethylsiloxane having an epoxy value of 0.1 to 5. In addition, a weight average molecular weight thereof is not particularly limited, but is usually 1,500 to 500,000, and is preferably 100,000 or less from the viewpoint of suppressing precipitation in the adhesive.

Specific examples of the epoxy group-containing polyorganosiloxane include, but are not limited to, an epoxy group-containing polyorganosiloxane represented by each of Formulas (E1) to (E3).

[Chem. 1]

(E1)

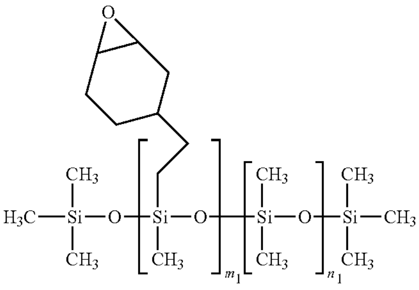

($m_1$ and $n_1$ represent the numbers of repeating units and are positive integers.)

[Chem. 2]

(E2)

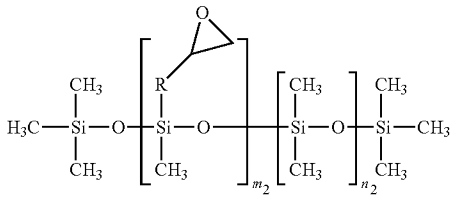

($m_2$ and $n_2$ represent the numbers of repeating units and are positive integers, and R is an alkylene group having 1 to 10 carbon atoms.)

[Chem. 3]

(E3)

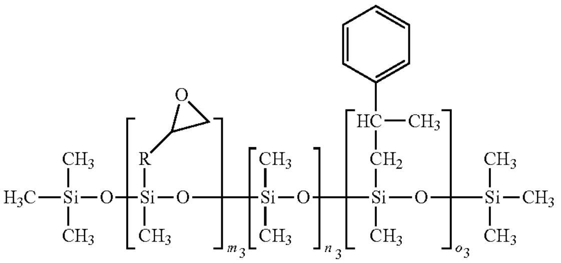

($m_3$, $n_3$, and 03 represent the numbers of repeating units and are positive integers, and R is an alkylene group having 1 to 10 carbon atoms.)

Examples of the methyl group-containing polyorganosiloxane include a methyl group-containing polyorganosiloxane containing a siloxane unit ($D^{200}$ unit) represented by $R^{210}R^{220}SiO_{2/2}$, and preferably a methyl group-containing polyorganosiloxane containing a siloxane unit ($D^{20}$ unit) represented by $R^{21}R^{21}Sio_{2/2}$.

$R^{210}$ and $R^{220}$ are groups bonded to silicon atoms, each independently represent an alkyl group, at least one of them is a methyl group, and specific examples of the alkyl group are the examples described above.

$R^{21}$ is a group bonded to a silicon atom and represents an alkyl group, and specific examples of the alkyl group include the examples described above. Among them, $R^{21}$ is preferably a methyl group.

In the present invention, preferred examples of the methyl group-containing polyorganosiloxane include, but are not limited to, a polydimethylsiloxane.

The methyl group-containing polyorganosiloxane contains the siloxane unit ($D^{200}$ unit or $D^{20}$ unit) described above, but may contain a Q unit, an M unit, and/or a T unit in addition to the $D^{200}$ unit and the $D^{20}$ unit.

In a certain aspect of the present invention, specific examples of the methyl group-containing polyorganosiloxane include a polyorganosiloxane containing only a $D^{200}$ unit, a polyorganosiloxane containing a $D^{200}$ unit and a Q unit, a polyorganosiloxane containing a $D^{200}$ unit and an M unit, a polyorganosiloxane containing a $D^{200}$ unit and a T unit, a polyorganosiloxane containing a $D^{200}$ unit, a Q unit, and an M unit, a polyorganosiloxane containing a $D^{200}$ unit, an M unit, and a T unit, and a polyorganosiloxane containing a $D^{200}$ unit, a Q unit, an M unit, and a T unit.

In a preferred aspect of the present invention, specific examples of the methyl group-containing polyorganosiloxane include a polyorganosiloxane containing only a $D^{20}$ unit, a polyorganosiloxane containing a $D^{20}$ unit and a Q unit, a polyorganosiloxane containing a $D^{20}$ unit and an M unit, a polyorganosiloxane containing a $D^{20}$ unit and a T unit, a polyorganosiloxane containing a $D^{20}$ unit, a Q unit, and an M unit, a polyorganosiloxane containing a $D^{20}$ unit, an M unit, and a T unit, and a polyorganosiloxane containing a $D^{20}$ unit, a Q unit, an M unit, and a T unit.

Specific examples of the methyl group-containing polyorganosiloxane include, but are not limited to, a methyl group-containing polyorganosiloxane represented by of Formula (M1).

[Chem. 4]

(M1)

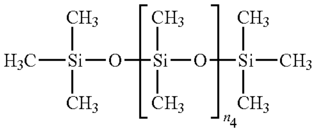

($n_4$ represents the number of repeating units and is a positive integer.)

Examples of the phenyl group-containing polyorganosiloxane include a phenyl group-containing polyorganosiloxane containing a siloxane unit ($D^{30}$ unit) represented by $R^{31}R^{32}SiO_{2/2}$.

$R^{31}$ is a group bonded to a silicon atom and represents a phenyl group or an alkyl group, and $R^{32}$ is a group bonded to a silicon atom and represents a phenyl group. Specific examples of the alkyl group include the examples described above, and a methyl group is preferable.

The phenyl group-containing polyorganosiloxane contains the siloxane unit ($D^{30}$ unit) described above, but may contain a Q unit, an M unit, and/or a T unit in addition to the $D^{30}$ unit.

In a preferred aspect of the present invention, specific examples of the phenyl group-containing polyorganosiloxane include a polyorganosiloxane containing only a $D^{30}$ unit, a polyorganosiloxane containing a $D^{30}$ unit and a Q unit, a polyorganosiloxane containing a $D^{30}$ unit and an M unit, a polyorganosiloxane containing a $D^{30}$ unit and a T unit, a polyorganosiloxane containing a $D^{30}$ unit, a Q unit, and an M unit, a polyorganosiloxane containing a $D^{30}$ unit, an M unit, and a T unit, and a polyorganosiloxane containing a $D^{30}$ unit, a Q unit, an M unit, and a T unit.

Specific examples of the methyl group-containing polyorganosiloxane include, but are not limited to, a methyl group-containing polyorganosiloxane represented by of Formula (P1) or (P2).

[Chem. 5]

(P1)

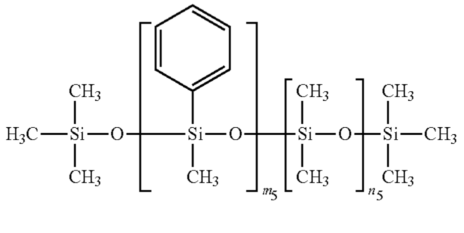

($m_5$ and $n_5$ represent the numbers of repeating units and are positive integers.)

[Chem. 6]

(P2)

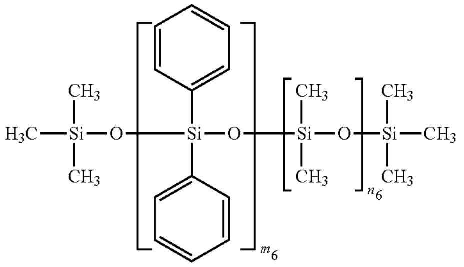

($m_6$ and $n_6$ represent the numbers of repeating units and are positive integers.)

In a preferred aspect the adhesive composition used in the present invention contains a component (B) which does not cause a curing reaction together with the component (A) which is cured, and in a more preferred aspect, a polyorganosiloxane is contained as the component (B).

As an example, the adhesive composition used in the present invention can contain the component (A) and the component (B) at any ratio, but in consideration of a balance between adhesiveness and peelability, a ratio of the component (A) to the component (B) is preferably 99.995:0.005 to 30:70 and more preferably 99.9:0.1 to 75:25 in terms of mass ratio [(A):(B)].

That is, in a case where the polyorganosiloxane component (A') which is cured by a hydrosilylation reaction is contained, a ratio of the component (A') to the component (B) is preferably 99.995:0.005 to 30:70 and more preferably 99.9:0.1 to 75:25 in terms of mass ratio [(A'):(B)].

The adhesive composition used in the present invention may contain a solvent for the purpose of adjusting the viscosity and the like, and specific examples thereof include, but are not limited to, an aliphatic hydrocarbon, an aromatic hydrocarbon, and a ketone.

More specific examples of the solvent include, but are not limited to, hexane, heptane, octane, nonane, decane, undecane, dodecane, isododecane, menthane, limonene, toluene, xylene, mesitylene, cumene, methyl isobutyl ketone (MIBK), butyl acetate, diisobutyl ketone, 2-octanone, 2-nonanone, and 5-nonanone. Such solvents can be used alone or in combination of two or more kinds thereof.

In a case where the adhesive composition used in the present invention contains a solvent, a content thereof is appropriately set in consideration of a viscosity of a desired composition, a coating method to be employed, a thickness of a film to be produced, and the like, but is in a range of about 10 to 90 mass % with respect to the entire composition.

A viscosity of the adhesive composition used in the present invention is not particularly limited, but is usually 500 to 20,000 mPa·s and preferably 1,000 to 5,000 mPa·s at 25° C. The viscosity of the adhesive composition used in the present invention can be adjusted by changing a type and a ratio of a solvent to be used, a concentration of film forming components, and the like in consideration of various factors such as a coating method to be used and a desired film thickness.

As an example, the adhesive composition used in the present invention can be prepared by mixing the component (A) with the component (B) and a solvent when used.

The mixing order is not particularly limited, but examples of a method by which an adhesive composition can be easily and reproducibly prepared include, but are not limited to, a method in which the component (A) and the component (B) are dissolved in a solvent, and a method in which a part of the component (A) and the component (B) is dissolved in a solvent, the rest is dissolved in the solvent, and the resulting solution is mixed. Note that, when the adhesive composition is prepared, the adhesive composition may be appropriately heated within a range in which the components are not decomposed or degenerated.

In the present invention, for the purpose of removing foreign substances, a solvent, a solution, or the like to be used may be filtered using a submicrometer-order filter or the like during the preparation of the adhesive composition or after mixing all the components.

A thickness of the adhesive layer included in the laminate of the present invention is not particularly limited, but is usually 5 to 500 μm, and is preferably 10 μm or more, more preferably 20 μm or more, and still more preferably 30 μm or more, from the viewpoint of maintaining film strength, and is preferably 200 μm or less, more preferably 150 μm or less, still more preferably 120 μm or less, and still more preferably 70 μm or less, from the viewpoint of avoiding non-uniformity caused by a thick film.

Hereinafter, an example of the laminate will be described with reference to the drawings.

FIG. 1 is a schematic cross-sectional view of an example of a laminate.

The laminate of FIG. 1 includes a semiconductor substrate 1 having bumps 1*a*, an inorganic material layer 2, an adhesive layer 3, and a support substrate 4 in this order.

The bumps 1*a* of the semiconductor substrate 1 are arranged on a side of the support substrate 4.

The inorganic material layer 2 is interposed between the semiconductor substrate 1 and the support substrate 4. The inorganic material layer 2 is in contact with the semiconductor substrate 1. Then, the inorganic material layer 2 covers the bumps 1*a*.

The adhesive layer 3 is interposed between the inorganic material layer 2 and the support substrate 4. The adhesive layer 3 is in contact with the inorganic material layer 2 and the support substrate 4.

The laminate of the present invention is preferably manufactured, for example, by the following method for manufacturing a laminate of the present invention.

(Method For Manufacturing Laminate)

The method for manufacturing a laminate of the present invention includes an inorganic material layer forming step, an adhesive coating layer forming step, and an adhesive layer forming step, and further includes other steps such as a bonding step as necessary.

<Inorganic Material Layer Forming Step>

The inorganic material layer forming step is not particularly limited as long as it is a step of forming an inorganic material layer on a surface of the semiconductor substrate on which the bumps exist, and examples thereof include a step including the method for forming an inorganic material layer described above in the description of the inorganic material layer.

<Adhesive Coating Layer Forming Step>

The adhesive coating layer forming step is not particularly limited as long as it is a step of forming an adhesive coating layer that finally provides an adhesive layer in contact with the support substrate and the inorganic material layer, and examples thereof include a step including a method of applying an adhesive composition onto the inorganic material layer or the support substrate and then heating (pre-heating treating) the adhesive composition to form an adhesive coating layer that is an uncured or non-completely cured adhesive layer. In this way, the adhesive coating layer is formed on the inorganic material layer formed on the semiconductor substrate or on the support substrate.

The coating method is not particularly limited, but is usually a spin coating method. Note that a method of separately forming a coating film by a spin coating method or the like and attaching the sheet-like coating film as an adhesive coating layer can be obtained.

A thickness of the adhesive coating layer is appropriately determined in consideration of the thickness of the adhesive layer in the laminate and the like.

In a case where the adhesive composition contains a solvent, the applied adhesive composition is usually heated.

A heating temperature of the applied adhesive composition varies depending on the type and amount of the adhesive component contained in the adhesive composition, whether or not a solvent is contained, a boiling point of a solvent to be used, a desired thickness of the adhesive layer, and the like, and thus cannot be generally specified, but the heating temperature is usually 80 to 150° C., and a heating time is usually 30 seconds to 5 minutes.

The heating can be performed using a hot plate, an oven, or the like.

<Adhesive Layer Forming Step>

The adhesive layer forming step is not particularly limited as long as it is a step of forming an adhesive layer by heating the adhesive coating layer in a state where the support substrate and the adhesive coating layer are in contact with each other and the adhesive coating layer and the inorganic material layer are in contact with each other (post-heating treatment). For example, two substrates (the semiconductor substrate and the support substrate) are arranged so as to interpose two layers (the inorganic material layer and the adhesive coating layer) therebetween using the semiconductor substrate on which the inorganic material layer and the adhesive coating layer are formed and the support substrate, or using the semiconductor substrate on which the inorganic material layer is formed and the support substrate on which the adhesive coating layer is formed so that the support substrate and the adhesive coating layer are in contact with each other and the adhesive coating layer and the inorganic material layer are in contact with each other, and then the heating treatment may be performed.

The temperature and time of heating are not particularly limited as long as they are temperature and time at which the adhesive coating layer is converted into the adhesive layer.

The heating temperature is preferably 120° C. or higher from the viewpoint of realizing a sufficient curing rate and the like, and is preferably 260° C. or lower from the viewpoint of preventing degeneration of the respective layers (including the support substrate and the semiconductor substrate) constituting the laminate.

The heating time is preferably 1 minute or longer, and more preferably 5 minutes or longer, from the viewpoint of realizing preferred bonding of the respective layers (including the support substrate and the semiconductor substrate) constituting the laminate, and is preferably 180 minutes or shorter, and more preferably 120 minutes or shorter, from the viewpoint of suppressing or avoiding adverse effects on the respective layers and the like due to excessive heating.

The heating can be performed using a hot plate, an oven, or the like.

<Bonding Step>

It is preferable to perform the bonding step between the adhesive layer forming step and the adhesive layer forming step in order to sufficiently bond the semiconductor substrate and the support substrate to each other.

The bonding step is not particularly limited as long as the substrate and the layer can be bonded to each other and the substrate or the layer is not damaged, but typically, the bonding step is a step in which a load can be applied in a thickness direction of the support substrate and the semiconductor substrate, and more preferably a step in which a load can be applied in a thickness direction of the support substrate and the semiconductor substrate under reduced pressure.

The load is not particularly limited as long as the substrate and the layer can be bonded to each other and the substrate or the layer is not damaged, but is, for example, 10 to 1,000 N.

A degree of reduced pressure is not particularly limited as long as the substrate and the layer can be bonded to each other and the substrate or the layer is not damaged, but is, for example, 10 to 10,000 Pa.

(Method for Manufacturing Semiconductor Substrate)

The method for manufacturing a semiconductor substrate of the present invention includes at least a processing step, a peeling step, and a removal step, and further includes other steps as necessary.

<Processing Step>

The processing step is not particularly limited as long as it is a step of processing the semiconductor substrate in the laminate of the present invention, and includes, for example, a polishing treatment, a through-electrode forming treatment, or the like.

<<Polishing Treatment>>

The polishing treatment is not particularly limited as long as it is a treatment of polishing the surface of the semiconductor substrate opposite to the surface on which the bumps exist to thin the semiconductor substrate, and examples thereof include physical polishing using a polishing agent or a grindstone.

The polishing treatment can be performed using a general polishing device used for polishing a semiconductor substrate.

By the polishing treatment, the thickness of the semiconductor substrate is reduced, and a semiconductor substrate thinned to a desired thickness is obtained. A thickness of the thinned semiconductor substrate is not particularly limited, but may be, for example, 30 to 300 μm or 30 to 100 μm.

<<Through-Electrode Forming Step>>

A through-electrode for realizing conduction between the thinned semiconductor substrates when a plurality of thinned semiconductor substrates are laminated may be formed on the polished semiconductor substrate.

Therefore, the method for manufacturing a semiconductor substrate may include a through-electrode forming treatment for forming a through-electrode on the polished semiconductor substrate after the polishing treatment and before the peeling step.

A method for forming a through-electrode on the semiconductor substrate is not particularly limited, and examples thereof include forming a through-hole and filling the formed through-hole with a conductive material.

The through-hole is formed by, for example, photolithography.

The filling of the through-hole with the conductive material is performed by, for example, a plating technique.

<Peeling Step>

The peeling step is not particularly limited as long as it is a step in which the support substrate and the processed semiconductor substrate are separated by separating the inorganic material layer and the adhesive layer from each other after the processing step, and examples thereof include a method of mechanically peeling with equipment having a sharp portion. Specifically, for example, the inorganic material layer and the adhesive layer are separated from each other by inserting the sharp portion between the support substrate and the semiconductor substrate.

The peeling step can be performed using a general peeling device used for peeling the support substrate and the semiconductor substrate.

<Removal Step>

The removal step is not particularly limited as long as it is a step of removing the inorganic material layer after the peeling step, and examples thereof include dissolution removal. In addition, the removal may be performed using a removal tape or the like. Note that, in a case where a residue of the adhesive layer on the inorganic material layer after the peeling step, the residue is also removed in the removal step.

In a case where a cleaning agent composition is used, for example, the semiconductor substrate with the inorganic material layer can be immersed in the cleaning agent composition or can be sprayed with the cleaning agent composition.

Preferred examples of the cleaning agent composition used in the present invention include cleaning agent compositions containing a quaternary ammonium salt and a solvent.

The quaternary ammonium salt is composed of a quaternary ammonium cation and an anion, and is not particularly limited as long as it is used for this type of application.

Examples of such a quaternary ammonium cation typically include tetra(hydrocarbon)ammonium cations. On the other hand, examples of an anion paired therewith include, but are not limited to, a hydroxide ion ($OH^-$); halogen ions such as a fluorine ion ($F^-$), a chlorine ion ($Cl^-$), a bromine ion ($Br^-$), and an iodine ion ($I^-$); a tetrafluoroborate ion ($BF_4^-$); and a hexafluorophosphate ion ($PF_6^-$).

In the present invention, the quaternary ammonium salt is preferably a halogen-containing quaternary ammonium salt, and more preferably a fluorine-containing quaternary ammonium salt.

In the quaternary ammonium salt, the halogen atom may be contained in the cation or the anion, but is preferably contained in the anion.

In a preferred aspect, the fluorine-containing quaternary ammonium salt is tetra(hydrocarbon)ammonium fluoride.

Specific examples of the hydrocarbon group in the tetra(hydrocarbon)ammonium fluoride include an alkyl group having 1 to 20 carbon atoms, an alkenyl group having 2 to carbon atoms, an alkynyl group having 2 to 20 carbon atoms, and an aryl group having 6 to 20 carbon atoms.

In a more preferred aspect, the tetra(hydrocarbon)ammonium fluoride includes tetraalkylammonium fluoride.

Specific examples of the tetraalkylammonium fluoride include, but are not limited to, tetramethylammonium fluoride, tetraethylammonium fluoride, tetrapropylammonium fluoride, and tetrabutylammonium fluoride (also referred to as tetrabutylammonium fluoride). Among them, tetrabutylammonium fluoride is preferable.

A quaternary ammonium salt such as tetra(hydrocarbon)ammonium fluoride may be used as a hydrate. In addition, quaternary ammonium salts such as tetra(hydrocarbon)ammonium fluoride may be used alone or in combination of two or more thereof.

The amount of the quaternary ammonium salt is not particularly limited as long as it dissolves in the solvent contained in the cleaning agent composition, but is usually to 30 mass % with respect to the cleaning agent composition.

The solvent contained in the cleaning agent composition used in the present invention is not particularly limited as long as it is used for this type of application and dissolves a salt such as the quaternary ammonium salt, but from the viewpoint of obtaining a cleaning agent composition having an excellent cleaning property with excellent reproducibility, the viewpoint of obtaining a cleaning agent composition having excellent uniformity by preferably dissolving a salt such as a quaternary ammonium salt, and the like, the cleaning agent composition used in the present invention preferably contains one or more amide-based solvents.

Preferred examples of the amide-based solvent include an acid amide derivative represented by Formula (Z).

[Chem. 7]

(Z)

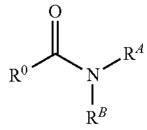

In the formula, $R^0$ represents an ethyl group, a propyl group, or an isopropyl group, and an ethyl group is preferable. $R^A$ and $R^B$ each independently represent an alkyl group having 1 to 4 carbon atoms. The alkyl group having 1 to 4 carbon atoms may be a linear, branched, or cyclic alkyl group, and specific examples thereof include a methyl group, an ethyl group, a propyl group, an isopropyl group, a cyclopropyl group, an n-butyl group, an isobutyl group, an s-butyl group, a t-butyl group, and a cyclobutyl group. Among them, $R^A$ and $R^B$ are preferably a methyl group or an ethyl group.

Examples of the acid amide derivative represented by Formula (Z) include N,N-dimethylpropionamide, N,N-diethylpropionamide, N-ethyl-N-methylpropionamide, N,N-dimethyl butyric acid amide, N,N-diethyl butyric acid amide, N-ethyl-N-methyl butyric acid amide, N,N-dimethyl isobutyric acid amide, N,N-diethyl isobutyric acid amide, and N-ethyl-N-methyl isobutyric acid amide. Among these, N,N-dimethylpropionamide is particularly preferable.

The acid amide derivative represented by Formula (Z) may be synthesized by a substitution reaction between a corresponding carboxylic acid ester and an amine, or a commercially available product may be used.

Another preferred example of the amide-based solvent includes a lactam compound represented by Formula (Y).

[Chem. 8]

(Y)

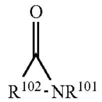

In the formula, $R^{101}$ represents an alkyl group having 1 to 6 carbon atoms. $R^{102}$ represents an alkylene group having 1 to 6 carbon atoms.

In Formula (Y), specific examples of the alkyl group having 1 to 6 carbon atoms include, but are not limited to, a methyl group, an ethyl group, an n-propyl group, and an n-butyl group, and specific examples of the alkylene group having 1 to 6 carbon atoms include, but are not limited to, a methylene group, an ethylene group, a trimethylene group, tetramethylene, a pentamethylene group, and a hexamethylene group.

Specific examples of the lactam compound represented by Formula (Y) include an α-lactam compound, a β-lactam compound, a γ-lactam compound, and a δ-lactam compound, and these compounds can be used alone or in combination of two or more thereof.

In a preferred aspect of the present invention, the lactam compound represented by Formula (Y) contains 1-alkyl-2-pyrrolidone (N-alkyl-γ-butyrolactam), in a more preferred aspect, N-methylpyrrolidone (NMP) or N-ethylpyrrolidone (NEP) is contained, and in a still more preferred aspect, N-methylpyrrolidone (NMP) is contained.

The cleaning agent composition used in the present invention may contain one or two or more other organic solvents different from the amide compound described above.

Such other organic solvents are used for this type of application, and are not particularly limited as long as they are organic solvents compatible with the amide compound described above.

Examples of preferred other solvents include, but are not limited to, alkylene glycol dialkyl ether, an aromatic hydrocarbon compound, a cyclic structure-containing ether compound.

The amount of the other organic solvents different from the amide compound described above is usually appropriately determined to be 95 mass % or less in the solvent contained in the cleaning agent composition as long as the quaternary ammonium salt contained in the cleaning agent composition is not precipitated or separated, and is uniformly mixed with the amide compound described above.

Note that the cleaning agent composition used in the present invention may contain water as a solvent, but usually, only an organic solvent is intentionally used as a solvent from the viewpoint of avoiding corrosion of the substrate and the like. Note that, in this case, it is not denied that hydrated water of a salt or water contained in a trace amount in the organic solvent is contained in the cleaning agent composition. A water content of the cleaning agent composition used in the present invention is usually 5 mass % or less.

An example of an aspect in which manufacturing of a laminate and manufacturing of a thinned wafer are performed in series will be described with reference to FIGS. 2A to 2I.

FIGS. 2A to 2I are views for explaining the aspect in which the laminate is manufactured and the thinned wafer is manufactured.

First, a wafer 1 having bumps 1*a* is prepared (FIG. 2A).

Next, an inorganic material layer 2 is formed on a surface of the wafer 1 on which the bumps 1*a* exist by plasma polymerization coating of an organosilicon compound 11 (FIG. 2B).

Next, an adhesive composition is applied onto the inorganic material layer 2 by spin coating using a coating device 12 to form an adhesive coating layer 3*a* (FIG. 2C).

Next, a heating device (hot plate) 13 is placed on a surface of the wafer 1 opposite to the surface on which the bumps 1*a* exist, and the adhesive coating layer 3*a* is heated by the heating device 13 to remove volatile components from the adhesive coating layer 3*a* (FIG. 2D).

Next, a support substrate 4 is arranged on the adhesive coating layer 3*a* (FIG. 2E).

Next, after a load is applied in a thickness direction of the wafer 1 and the support substrate 4 under reduced pressure, a heating device (hot plate) 14 is placed on the surface of the wafer 1 opposite to the surface on which the bumps 1*a* exist, and the adhesive coating layer 3*a* is heated by the heating device 14 to be converted into an adhesive layer 3 (FIG. 2F).

A laminate is obtained by the steps illustrated in FIGS. 2A to 2F.

Next, an example of manufacturing a thinned wafer will be described.

Next, the surface of the wafer 1 opposite to the surface on which the bumps 1*a* exist is polished using a polishing device (not illustrated) to thin the wafer 1 (FIG. 2G). Note that a through-electrode or the like may be formed on the thinned wafer 1.

Next, the thinned wafer 1 and the support substrate 4 are peeled off using a peeling device (not illustrated) (FIG. 2H). At this time, the inorganic material layer 2 and the adhesive layer 3 are peeled off, such that the thinned wafer 1 and the support substrate 4 are peeled off.

Next, the inorganic material layer 2 is dissolved and removed from the wafer 1 thinned by a cleaning agent composition 16 using a cleaning device 15 to clean the thinned wafer 1 (FIG. 2I).

As described above, the thinned wafer 1 is obtained.

EXAMPLES

Hereinafter, the present invention will be described in more detail with reference to Examples, but the present invention is not limited to the following Examples. Note that the devices used are as follows.

(1) Stirrer: manufactured by Thinky Corporation rotation and revolution mixer ARE-500

(2) Vacuum bonding device: manufactured by SUSS MicroTec SE auto bonder (3) Peeling device: manufactured by SUSS MicroTec SE manual debonder (4) Optical film thickness meter (film thickness measurement): manufactured by Filmetrics Japan, Inc. F-50

(5) High-rigidity grinding machine: manufactured by TOKYO SEIMITSU CO., LTD. HRG300

(6) Dicing machine: manufactured by TOKYO SEIMITSU CO., LTD. SS30

(7) Thermocompression bonding device: manufactured by Ayumi Industry Co., Ltd. attachment device

[1] Preparation of Adhesive Composition

Preparation Example 1

In a 600 mL stirring vessel dedicated from the stirrer, 104.14 g of a p-menthane solution (concentration: 80.6 mass %) of an MQ resin (manufactured by Wacker Chemie AG) having a polysiloxane skeleton and a vinyl group as a component (a1), 58.11 g of a polyorganosiloxane represented by the following Formula (M1-1) (manufactured by Wacker Chemie AG, trade name: AK1000000, viscosity: 1,000,000 $mm^2/s$) as a component (B), and 34.94 g of p-menthane (manufactured by NIPPON TERPENE CHEMICALS, INC.) and 6.20 g of n-decane (manufactured by SANKYO CHEMICAL CO., LTD.) as solvents were added, and stirring was performed with the stirrer for 5 minutes, thereby obtaining a mixture (I).

16.79 g of a SiH-group containing linear polydimethylsiloxane (manufactured by Wacker Chemie AG) having a viscosity of 100 mPa·s as a component (a2) and 24.54 g of a vinyl group-containing linear polydimethylsiloxane (manufactured by Wacker Chemie AG) having a viscosity of 200 mPa·s as the component (a1) were added to the obtained mixture (I), thereby obtaining a mixture (II).

1.61 g of 1,1-diphenyl-2-propyn-1-ol (manufactured by Tokyo Chemical Industry Co., Ltd.) and 1.61 g of 1-ethynyl-1-cyclohexanol (manufactured by Wacker Chemie AG) as components (A3), and 3.23 g of p-menthane (manufactured by NIPPON TERPENE CHEMICALS, INC.) as a solvent were stirred with the stirrer for 60 minutes, thereby obtaining a mixture (III).

1.29 g of the obtained mixture (III) was added to the mixture (II), and stirring was performed with the stirrer for 5 minutes, thereby obtaining a mixture (IV).

0.65 g of a platinum catalyst (manufactured by Wacker Chemie AG) as a component (A2) and 19.37 g of a vinyl group-containing linear polydimethylsiloxane (manufactured by Wacker Chemie AG) having a viscosity of 1,000 mPa·s as the component (a1) were stirred with the stirrer for 5 minutes, thereby obtaining a mixture (V).

4.00 g of the obtained mixture (V) was added to the mixture (IV), and stirring was performed with the stirrer for 5 minutes, thereby obtaining a mixture (VI).

Finally, the obtained mixture (VI) was filtered through a nylon filter with 300 mesh to obtain an adhesive composition. Note that a viscosity of the obtained adhesive composition was 3,000 mPa·s.

[Chem. 9]

(M1-1)

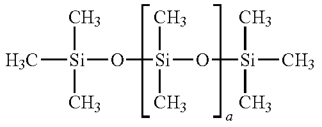

(In the formula, a represents the number of repeating units.)

[2] Preparation of Cleaning Agent Composition

Preparation Example 2

6 g of tetrabutylammonium fluoride trihydrate (manufactured by Kanto Chemical Co., Inc.) was mixed with 94 g of N,N-dimethylpropionamide, and the mixture was stirred well, thereby obtaining a cleaning agent composition.

[3] Evaluation of Adhesiveness and Peelability

[3-1]

Example 1-1

A plasma polymer layer (thickness: 320 nm) derived from hexamethyldisiloxane (HMDSO) as an inorganic material layer was formed on a circuit surface of a 300 mm silicon wafer (thickness: 770 μm) as a device-side wafer by a CVD method. CVD was performed under conditions of 40 W, 65 mTorr, and an HMDSO flow rate of 15 sccm. The adhesive composition obtained in Preparation Example 1 was applied onto the plasma polymer layer by spin coating, and heating (pre-heating treatment) was performed at 120° C. for 1.5 minutes, thereby forming an adhesive coating layer on the plasma polymer layer so that a thickness of the adhesive layer in the obtained laminate was about 65 μm.

Thereafter, in a vacuum bonding device, a silicon wafer including the plasma polymer layer and the adhesive coating layer and a 300 mm glass wafer (thickness: 700 μm) as a carrier-side wafer (support) were bonded to each other so as to interpose the plasma polymer layer and the adhesive coating layer therebetween, and heating (post-heating treatment) was performed on a hot plate with the device-side wafer facing down at 200° C. for 10 minutes, thereby manufacturing a laminate. Note that bonding was performed under a load of 100 N at a temperature of 23° C. and a degree of reduced pressure of 1,000 Pa.

Example 1-2

A plasma polymer layer (thickness: 500 nm) derived from HMDSO as an inorganic material layer was formed on a circuit surface of a 300 mm silicon wafer (thickness: 770 μm) as a device-side wafer by a CVD method. CVD was performed under conditions of 120 W, 65 mTorr, and an HMDSO flow rate of 15 sccm. The adhesive composition obtained in Preparation Example 1 was applied onto the plasma polymer layer by spin coating, and heating (pre-heating treatment) was performed at 120° C. for 1.5 minutes, thereby forming an adhesive coating layer on the plasma polymer layer so that a thickness of the adhesive layer in the obtained laminate was about 65 μm.

Thereafter, in a vacuum bonding device, a silicon wafer including the plasma polymer layer and the adhesive coating layer and a 300 mm glass wafer (thickness: 700 μm) as a carrier-side wafer (support) were bonded to each other so as to interpose the plasma polymer layer and the adhesive coating layer therebetween, and heating (post-heating treatment) was performed on a hot plate with the device-side wafer facing down at 200° C. for 10 minutes, thereby manufacturing a laminate. Note that bonding was performed under a load of 100 N at a temperature of 23° C. and a degree of reduced pressure of 1,000 Pa.

Comparative Example 1-1

The adhesive composition obtained in Preparation Example 1 was applied to a 300 mm silicon wafer (thickness: 770 μm) as a device-side wafer by spin coating, and heating (pre-heating treatment) was performed at 120° C. for 1.5 minutes, thereby forming an adhesive coating layer on a circuit surface of the wafer so that a thickness of the adhesive layer in the obtained laminate was about 65 μm.

Thereafter, in a vacuum bonding device, a silicon wafer including the adhesive coating layer and a 300 mm glass wafer (thickness: 700 μm) as a carrier-side wafer (support) were bonded to each other so as to interpose the adhesive coating layer therebetween, and heating (post-heating treatment) was performed on a hot plate with the device-side wafer facing down at 200° C. for 10 minutes, thereby manufacturing a laminate. Note that bonding was performed under a load of 100 N at a temperature of 23° C. and a degree of reduced pressure of 1,000 Pa.

[3-2] Evaluation of Adhesiveness and Peelability

The adhesiveness and peelability of the adhesive layer were evaluated using the laminates obtained in Examples 1-1 and 1-2.

The adhesiveness was evaluated by visually confirming the presence or absence of voids from the glass wafer (support) side of the laminate. In a case where no voids were confirmed, the adhesiveness was evaluated as good, and in a case where voids were confirmed, the adhesiveness was evaluated as poor.

As a result, no voids were confirmed in the laminates obtained in Examples 1-1 and 1-2.

In the evaluation of the peelability, the force required for peeling was measured, and a case where peeling could be performed by a peeling device was evaluated as good, and a case where peeling could not be performed was evaluated as poor. Note that the peeling location was between the plasma polymer layer and the adhesive layer.

As a result, in each of the laminates obtained in Examples 1-1 and 1-2, the plasma polymer layer and the adhesive layer were preferably peeled off with a force of 16 N.

[3-3] Confirmation of Cleanability

The semiconductor substrate with a plasma polymer layer peeled from the laminate obtained in Example 1-1 was fixed, cut into a size of 4 cm×4 cm with a dicing machine, and cut into 4 cm square chips. This chip was immersed in 9 mL of the cleaning agent composition obtained in Preparation Example 2 for 1 minute, and the presence or absence of the adhesive residue and the plasma polymer layer on the chip was confirmed with an optical microscope and an optical film thickness meter.

As a result, the adhesive residue and the plasma polymer layer were not confirmed on the chip, and it was confirmed that the adhesive residue and the plasma polymer layer could be preferably removed by immersion in the cleaning agent composition.

[4] Manufacturing of Laminate for High-Temperature and High-Pressure Treatment Test

[4-1] Manufacturing of Laminate

Example 2-1

A plasma polymer layer (thickness: 320 nm) derived from HMDSO as an inorganic material layer was formed on a circuit surface of a PI TEG 300 mm silicon wafer (thickness: 770 μm, bump diameter: 0.03 mm, bump height: 0.04 mm, bump pitch: 0.06×0.1 mm) as a device-side wafer by a CVD method. CVD was performed under conditions of 40 W, 65 mTorr, and an HMDSO flow rate of 15 sccm. The adhesive composition obtained in Preparation Example 1 was applied onto the plasma polymer layer by spin coating, and heating (pre-heating treatment) was performed at 120° C. for 1.5 minutes, thereby forming an adhesive coating layer on the plasma polymer layer so that a thickness of the adhesive layer in the obtained laminate was about 65 μm.

Thereafter, in a vacuum bonding device, a silicon wafer including the plasma polymer layer and the adhesive coating layer and a 300 mm glass wafer (thickness: 700 μm) as a wafer (support) on a carrier side were bonded to each other so as to interpose the plasma polymer layer and the adhesive coating layer therebetween, and heating (post-heating treatment) was performed on a hot plate with the device-side wafer facing down at 200° C. for 10 minutes, thereby manufacturing a laminate. Note that bonding was performed under a load of 100 N at a temperature of 23° C. and a degree of reduced pressure of 1,000 Pa.

The silicon wafer of the obtained laminate was thinned to a thickness of 50 μm with a high rigidity grinder, and then the thinned silicon wafer side was stuck to a dicing tape (manufactured by Nitto Denko Corporation, DU-300) downward and fixed.

The fixed laminate was cut into a size of 4 cm×4 cm by a dicing machine, and cut into chips of a 4 cm square laminate to be used in a high-temperature and high-pressure treatment test.

Example 2-2

A plasma polymer layer (thickness: 500 nm) derived from HMDSO as an inorganic material layer was formed on a circuit surface of a PI TEG 300 mm silicon wafer (thickness: 770 μm, bump diameter: 0.03 mm, bump height: 0.04 mm, bump pitch: 0.06×0.1 mm) as a device-side wafer by a CVD method. CVD was performed under conditions of 120 W, 65 mTorr, and an HMDSO flow rate of 15 sccm. The adhesive composition obtained in Preparation Example 1 was applied onto the plasma polymer layer by spin coating, and heating (pre-heating treatment) was performed at 120° C. for 1.5 minutes, thereby forming an adhesive coating layer on the plasma polymer layer so that a thickness of the adhesive layer in the obtained laminate was about 65 μm.

Thereafter, in a vacuum bonding device, a silicon wafer including the plasma polymer layer and the adhesive coating layer and a 300 mm glass wafer (thickness: 700 μm) as a wafer (support) on a carrier side were bonded to each other so as to interpose the plasma polymer layer and the adhesive coating layer therebetween, and heating (post-heating treatment) was performed on a hot plate with the device-side wafer facing down at 200° C. for 10 minutes, thereby manufacturing a laminate. Note that bonding was performed under a load of 100 N at a temperature of 23° C. and a degree of reduced pressure of 1,000 Pa.

The silicon wafer of the obtained laminate was thinned to a thickness of 50 μm with a high rigidity grinder, and then the thinned silicon wafer side was stuck to a dicing tape (manufactured by Nitto Denko Corporation, DU-300) downward and fixed.

The fixed laminate was cut into a size of 4 cm×4 cm by a dicing machine, and cut into chips of a 4 cm square laminate to be used in a high-temperature and high-pressure treatment test.

Comparative Example 2-1

The adhesive composition obtained in Preparation Example 1 was applied to a PI TEG 300 mm silicon wafer (thickness: 770 μm, bump diameter: 0.03 mm, bump height: 0.04 mm, bump pitch: 0.06×0.1 mm) as a device-side wafer by spin coating, and heating (pre-heating treatment) was performed at 120° C. for 1.5 minutes, thereby forming an adhesive coating layer on a circuit surface of the wafer so that a thickness of the adhesive layer in the obtained laminate was about 65 μm.

Thereafter, in a vacuum bonding device, a silicon wafer including the adhesive coating layer and a 300 mm glass wafer (thickness: 700 μm) as a carrier-side wafer (support) were bonded to each other so as to interpose the adhesive coating layer therebetween, and heating (post-heating treatment) was performed on a hot plate with the device-side wafer facing down at 200° C. for 10 minutes, thereby manufacturing a laminate. Note that bonding was performed under a load of 100 N at a temperature of 23° C. and a degree of reduced pressure of 1,000 Pa.

The silicon wafer of the obtained laminate was thinned to a thickness of 50 μm with a high rigidity grinder, and then the thinned silicon wafer side was stuck to a dicing tape (manufactured by Nitto Denko Corporation, DU-300) downward and fixed.

The fixed laminate was cut into a size of 4 cm×4 cm by a dicing machine, and cut into chips of a 4 cm square laminate to be used in a high-temperature and high-pressure treatment test.

[5] High-Temperature and High-Pressure Treatment Test

Using a thermocompression bonding device, the chips of the laminates obtained in Examples 2-1 and 2-2 and Comparative Example 2-1 were subjected to a high-temperature and high-pressure treatment. The treatment was performed according to the following procedure.

The glass wafer (support substrate) of the chip of the laminate was placed on a stage set at 60° C. so as to face down, and heating was performed from the silicon wafer (semiconductor substrate) side while applying a pressure in a vertical direction of the silicon wafer and the glass wafer under thermocompression bonding conditions of a temperature of 270° C., a pressure of 160 $N/cm^3$, and a processing time of 20 seconds.

The state of the silicon wafer of each laminate after the treatment was observed through the glass wafer that was the support substrate using an optical microscope, and the presence or absence of bump deformation was visually confirmed. The number of bumps in the chip of one laminate was 5,044, a case where the number of deformed bumps was 200 or less was determined as good, and a case where the number of deformed bumps was more than 200 was determined as poor. The results are shown in Table 1.

TABLE 1

| | Bump deformation |
|---|---|
| Example 2-1 | Good |
| Example 2-2 | Good |
| Comparative Example 2-1 | Poor |

As shown in Table 1, bump deformation caused by the high-temperature and high-pressure treatment could be suppressed in the laminate including the plasma polymer layer derived from HMDSO as the inorganic material layer.

INDUSTRIAL APPLICABILITY

According to the present invention, it is possible to suppress bump deformation while suppressing the number of layers interposed between the semiconductor substrate and the support substrate, which is useful for manufacturing a processed semiconductor substrate.

REFERENCE SIGNS LIST

1 Wafer
**1*a*** Bump
2 Inorganic material layer
3 Adhesive layer
**3*a*** Adhesive coating layer
4 Support substrate
11 Organosilicon compound
12 Coating device
13 Heating device
14 Heating device
15 Cleaning device
16 Cleaning agent composition

The invention claimed is:

1. A laminate comprising:

a support substrate;

a semiconductor substrate having a bump on a side of the support substrate;

an inorganic material layer interposed between the support substrate and the semiconductor substrate and in contact with the semiconductor substrate; and an adhesive layer interposed between the support substrate and the inorganic material layer and in contact with the support substrate and the inorganic material layer, the adhesive layer being a layer formed of an adhesive composition, wherein the adhesive composition contains a component (A) which is cured and a polyorganosiloxane as a component (B) which does not cause a curing reaction, wherein the component (A) contains:

a polyorganosiloxane (a1) having an alkenyl group having 2 to 40 carbon atoms bonded to a silicon atom, a polyorganosiloxane (a2) having a Si—H group, and a platinum group metal-based catalyst (A2), the laminate is used for an application in which the support substrate and the semiconductor substrate are separated from each other after processing of the semiconductor substrate in the laminate, and an adhesive force between the inorganic material layer and the adhesive layer when the support substrate and the semiconductor substrate are separated from each other is smaller than an adhesive force between the inorganic material layer and the semiconductor substrate.

2. The laminate according to claim 1, wherein the component (A) is a component which is cured by a hydrosilylation reaction.

3. The laminate according to claim 1, wherein the component (B) is a polydimethylsiloxane.

4. The laminate according to claim 1, wherein the inorganic material layer is a layer obtained by plasma-polymerizing an organosilicon compound on the semiconductor substrate.

5. A method for manufacturing a semiconductor substrate, the method comprising:

processing the semiconductor substrate in the laminate according to claim 1;

separating the support substrate and the processed semiconductor substrate from each other by separating the inorganic material layer and the adhesive layer from each other; and removing the inorganic material layer.

6. The method for manufacturing a semiconductor substrate according to claim 5, wherein the processing includes polishing a surface of the semiconductor substrate opposite to a surface on which the bump exists to thin the semiconductor substrate.

7. A method for manufacturing the laminate according to claim 1, the method comprising:

forming the inorganic material layer on a surface of the semiconductor substrate on which the bump exists;

forming an adhesive coating layer which provides the adhesive layer on the inorganic material layer;

forming the adhesive layer by heating the adhesive coating layer in a state where the support substrate and the adhesive coating layer are in contact with each other and the adhesive coating layer and the inorganic material layer are in contact with each other.

8. The laminate according to claim 1, wherein the component (B) includes a modified polydimethylsiloxane.

* * * * *